United States Patent
Logan et al.

(10) Patent No.: US 12,362,724 B2
(45) Date of Patent: Jul. 15, 2025

(54) N-POLAR RARE-EARTH III-NITRIDE BULK ACOUSTIC WAVE RESONATOR

(71) Applicant: Raytheon Company, Waltham, MA (US)

(72) Inventors: John A. Logan, Lawrence, MA (US); Clay T. Long, Medford, MA (US); Adam E. Peczalski, Everett, MA (US)

(73) Assignee: Raytheon Company, Arlington, VA (US)

( * ) Notice: Subject to any disclaimer, the term of this patent is extended or adjusted under 35 U.S.C. 154(b) by 727 days.

(21) Appl. No.: 17/408,040

(22) Filed: Aug. 20, 2021

(65) Prior Publication Data

US 2023/0055905 A1 Feb. 23, 2023

(51) Int. Cl.
| | |
|---|---|
| H03H 9/17 | (2006.01) |
| H03H 3/02 | (2006.01) |
| H03H 9/02 | (2006.01) |
| H03H 9/13 | (2006.01) |

(52) U.S. Cl.
CPC ............... *H03H 9/17* (2013.01); *H03H 3/02* (2013.01); *H03H 9/02015* (2013.01); *H03H 9/13* (2013.01)

(58) Field of Classification Search
CPC ......... H03H 9/17; H03H 9/02015; H03H 9/13
See application file for complete search history.

(56) References Cited

U.S. PATENT DOCUMENTS

| | | | |
|---|---|---|---|
| 10,432,162 B2 | 10/2019 | Grannen et al. | |
| 10,673,405 B2 | 6/2020 | Dasgupta et al. | |
| 10,700,665 B2 | 6/2020 | Then et al. | |
| 10,848,127 B2 | 11/2020 | Block et al. | |
| 10,979,012 B2 | 4/2021 | Dasgupta et al. | |
| 11,031,989 B2 | 6/2021 | Shealy et al. | |
| 11,043,627 B2 | 6/2021 | Then et al. | |
| 2003/0112095 A1 | 6/2003 | Wang et al. | |
| 2014/0246305 A1* | 9/2014 | Larson, III | H03H 9/584 |
| | | | 204/192.18 |

(Continued)

FOREIGN PATENT DOCUMENTS

| | | |
|---|---|---|
| JP | 2006503448 A | 1/2006 |
| WO | 03/052929 A1 | 6/2003 |

OTHER PUBLICATIONS

Office Action dated Jul. 6, 2023 for corresponding Taiwan Application No. 111131249.

(Continued)

*Primary Examiner* — Bryan P Gordon
(74) *Attorney, Agent, or Firm* — Bachman & LaPointe, P.C.

(57) ABSTRACT

A bulk acoustic wave (BAW) resonator includes a piezoelectric layer oriented so that an N-polar surface forms a frontside surface that faces away from the substrate while a metal-polar surface forms the backside surface and faces toward the substrate. A process for the manufacture of a bulk acoustic wave (BAW) resonator includes orienting a piezoelectric layer on a substrate so that an N-polar surface forms a frontside surface that faces away from the substrate while a metal-polar surface forms the backside surface and faces toward the substrate; etching a via though the backside of the substrate to the metal-polar surface of the piezoelectric layer; and removing etch residue from a sidewall of the resonator cavity.

9 Claims, 9 Drawing Sheets

(56) References Cited

U.S. PATENT DOCUMENTS

| | | | |
|---|---|---|---|
| 2015/0357994 A1 | 12/2015 | Shealy | |
| 2018/0175821 A1 | 6/2018 | Sadhu et al. | |
| 2019/0068164 A1* | 2/2019 | Houlden | H03H 3/02 |
| 2019/0305752 A1* | 10/2019 | Sadhu | H03H 9/175 |
| 2019/0334023 A1* | 10/2019 | Nakata | H10D 30/475 |
| 2019/0356301 A1* | 11/2019 | Yoon | H03H 9/02047 |
| 2020/0252046 A1 | 8/2020 | Shin et al. | |
| 2020/0331750 A1 | 10/2020 | Sadaka et al. | |
| 2020/0365794 A1* | 11/2020 | Thomas | C23C 14/0641 |
| 2021/0126614 A1 | 4/2021 | Fries et al. | |

OTHER PUBLICATIONS

Yanagitani et al., ScAlN polarization inverted resonators and enhancement of kt2 in new YbAlN materials for BAW devices, 2019 IEEE International Ultrasonics Symposium (IUS); Glasgow, Scotland, Oct. 6-9, 2019., pp. 894-899, https://doi.org/10.1109/ULTSYM.2019.8925786.

Suzuki et al., Polarity-inverted ScAlN film growth by ion beam irradiation and application to overtone acoustic wave (000-1)/(0001) film resonators, Appl. Phys. Lett. 104, 172905 (2014); US, https://doi.org/10.1063/1.4874840.

Miller et al., All-Epitaxial Bulk Acoustic Wave Resonators, Phys. Status Solidi A (2020), 217, 1900786, Wiley-VCH Verlag Gmbh & Co. KGaA, Weinheim, Germany; https://doi.org/10.1002/pssa.201900786.

Wang Jialin et al: "Ferroelectric Aluminum Scandium Nitride Thin Film Bulk Acoustic Resonators with Polarization-Dependent Operating States", Physica Status Solidi. Rapid Research Letters, vol. 15, No. 5, Apr. 23, 2021, pp. 2100034-2100031, XP093003946.

Agarwal Vanita R et al: "Review: Back-Side via Hole Etching Process for Grounding GaAs Based Monolithic Microwave Integrated Circuits", Journal of the Electrochemical Society, vol. 152, No. 7, Jan. 2005, pp. G567-G576, XP093004395.

Akiyama Morito et al: "Polarity inversion in aluminum nitride thin films under high sputtering power", Applied Physics Letters, vol. 90, No. 15, Apr. 11, 2007, pp. 151910-151910, XP012094067.

International Search Report and Written Opinion dated Dec. 19, 2022 for corresponding application PCT/US2022/040737.

Office Action dated Feb. 12, 2025, issued in corresponding application JP2024-509067.

* cited by examiner

N-POLAR RARE-EARTH III-NITRIDE BULK ACOUSTIC WAVE RESONATOR

BACKGROUND

The present disclosure relates to single crystal thin-film bulk acoustic resonator devices, and more particularly to a process for the manufacture of an epitaxial nitrogen-polar (N-polar) scandium-doped aluminum nitride (ScAlN) based heterostructure bulk acoustic wave (BAW) resonator.

Bulk Acoustic Wave (BAW) resonators may be used for high-frequency filtering of signals. Various structures and materials are used to manufacture BAW resonators. These structures generally are formed of a thin layer of piezoelectric material sandwiched between two electrically conductive electrodes that are acoustically isolated from a substrate.

The development of single crystal thin-film bulk acoustic resonator devices requires substantial processing on both the frontside and backside of the wafer. The N-polar surface of ScAlN based heterostructures may be sensitive to processing chemistries. Further, as the N-polar ScAlN surface is exposed during the backside processing of a conventional metal-polar ScAlN based heterostructure, it may be especially difficult to protect.

SUMMARY

A bulk acoustic wave (BAW) resonator according to one disclosed non-limiting embodiment of the present disclosure includes a piezoelectric layer oriented so that a N-polar surface forms a frontside surface that faces away from a substrate while a metal-polar surface forms a backside surface and faces toward the substrate.

A further embodiment of any of the foregoing embodiments of the present disclosure includes a via through the substrate to the metal-polar surface.

A further embodiment of any of the foregoing embodiments of the present disclosure includes that the substrate is silicon carbide.

A further embodiment of any of the foregoing embodiments of the present disclosure includes that the substrate is sapphire.

A further embodiment of any of the foregoing embodiments of the present disclosure includes that the substrate is GaN.

A further embodiment of any of the foregoing embodiments of the present disclosure includes that the piezoelectric layer is a mono-crystalline aluminum-nitride-compound.

A further embodiment of any of the foregoing embodiments of the present disclosure includes that the piezoelectric layer is Scandium-doped Aluminum Nitride (ScAlN).

A further embodiment of any of the foregoing embodiments of the present disclosure includes that the piezoelectric layer is yttrium-aluminum-nitride ($Y_xAl_{(1-x)}N$).

A further embodiment of any of the foregoing embodiments of the present disclosure includes that the substrate includes a via.

A further embodiment of any of the foregoing embodiments of the present disclosure includes a frontside electrode and a backside electrode, the backside electrode defining a resonator within the via.

A process for the manufacture of a bulk acoustic wave (BAW) resonator, according to one disclosed non-limiting embodiment of the present disclosure includes orienting a piezoelectric layer on a substrate so that an N-polar surface forms a frontside surface that faces away from the substrate while a metal-polar surface forms a backside surface and faces toward the substrate; etching a via though the backside of the substrate to the metal-polar surface of the piezoelectric layer; and removing etch residue from a sidewall of the via.

A further embodiment of any of the foregoing embodiments of the present disclosure includes depositing a frontside electrode on the N-polar surface.

A further embodiment of any of the foregoing embodiments of the present disclosure includes applying a mask prior to the etching.

A further embodiment of any of the foregoing embodiments of the present disclosure includes depositing a backside electrode on the metal-polar surface.

A further embodiment of any of the foregoing embodiments of the present disclosure includes removing the etch residue from the sidewall of the via further is cleaning.

A further embodiment of any of the foregoing embodiments of the present disclosure includes that the piezoelectric layer is a mono-crystalline aluminum-nitride-compound.

A further embodiment of any of the foregoing embodiments of the present disclosure includes that the piezoelectric layer is Scandium-doped Aluminum Nitride (ScAlN).

A further embodiment of any of the foregoing embodiments of the present disclosure includes that the piezoelectric layer is yttrium-aluminum-nitride ($Y_xAl_{(1-x)}N$).

A further embodiment of any of the foregoing embodiments of the present disclosure includes temporarily bonding the piezoelectric layer and a frontside electrode to a bonding carrier.

A further embodiment of any of the foregoing embodiments of the present disclosure includes wherein the temporarily bonding of the piezoelectric layer and the frontside electrode to the bonding carrier is accomplished with a bonding medium.

The foregoing features and elements may be combined in various combinations without exclusivity, unless expressly indicated otherwise. These features and elements as well as the operation thereof will become more apparent in light of the following description and the accompanying drawings. It should be appreciated, however, the following description and drawings are intended to be exemplary rather than defined by the limitations within and are non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
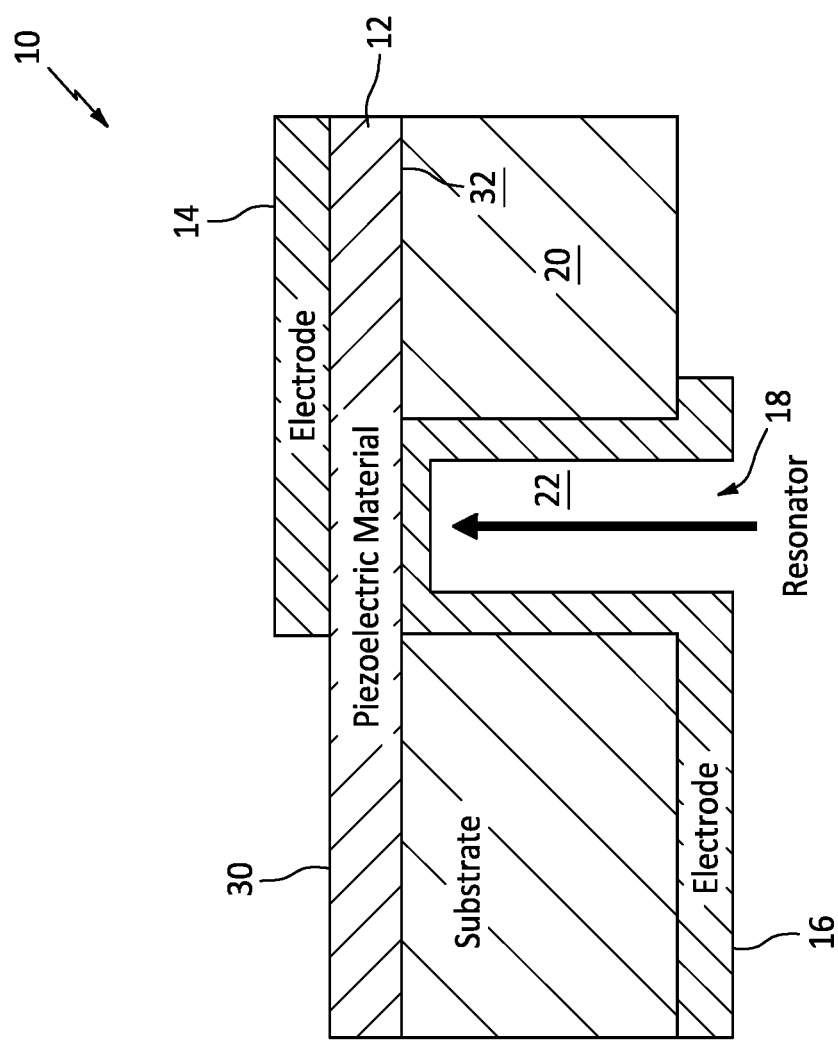
FIG. 1 is a schematic cross-sectional view of an epitaxial nitrogen-polar (N-polar) scandium-doped aluminum nitride (ScAlN) based heterostructure bulk acoustic wave (BAW) resonator.

FIG. 1 schematically illustrates an example epitaxial nitrogen-polar (N-polar) ScAlN-based heterostructure bulk acoustic wave (BAW) resonator 10. The BAW resonator structure 10 includes a mono-crystalline aluminum-nitride-compound piezoelectric layer 12 sandwiched between a frontside electrode 14 and a substrate 20 having one or more vias 22 formed in the substrate. A backside electrode 16 can be disposed along the backside of the substrate 20 and into a via 22, where, opposite the frontside electrode 14, a resonator 18 is defined. The piezoelectric layer 12 is thereby free to resonate at very specific frequencies set by the thickness and composition of the suspended membrane. Vias 22 may be formed in the substrate 20 to form an access port to fashion a required connection between two layers, and for other reasons. Dielectric layer(s) may be optionally utilized for passivation and to mechanically load the structure.

Various types of aluminum-nitride compounds can be used in the piezoelectric layer 12. For example, scandium-aluminum-nitrides ($Sc_xAl_{(1-x)}N$) or yttrium-aluminum-nitrides ($Y_xAl_{(1-x)}N$). The subscript x used in the $Sc_xAl_{(1-x)}N$ formula can be between 0 and 0.50, between 0.15 and 0.45, or between 0.28 and 0.43, for example. Here, the piezoelectric response of the material changes in response to changes in the relative-composition index, x, as is known in the art (see, e.g., Akiyama et al. *Appl. Phys. Lett.* 95 162107 (2009)). Some considerations for the choice of relative-composition index of the mono-crystalline aluminum-nitride-compound piezoelectric layer 12 include: desired piezoelectric response, desired operating frequency, growth temperature, and lattice parameter strain. Orienting the crystal in a N-polar configuration, rather than metal-polar configuration, flips the direction of the polarization fields intrinsic to the piezoelectric layer 12. However, the magnitude of the piezoelectric response is unchanged for an otherwise identical layer (for example, in crystal quality, composition, thickness, etc.).

Figure 2B:
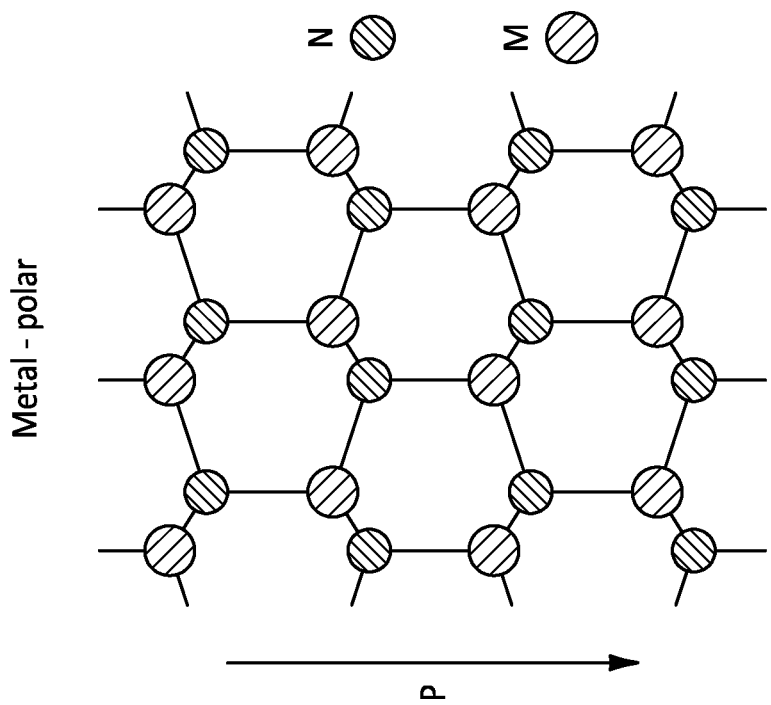
FIGS. 2A and 2B illustrate III-nitride N-polar and metal-polar crystal orientation diagrams.
Figure 2A:
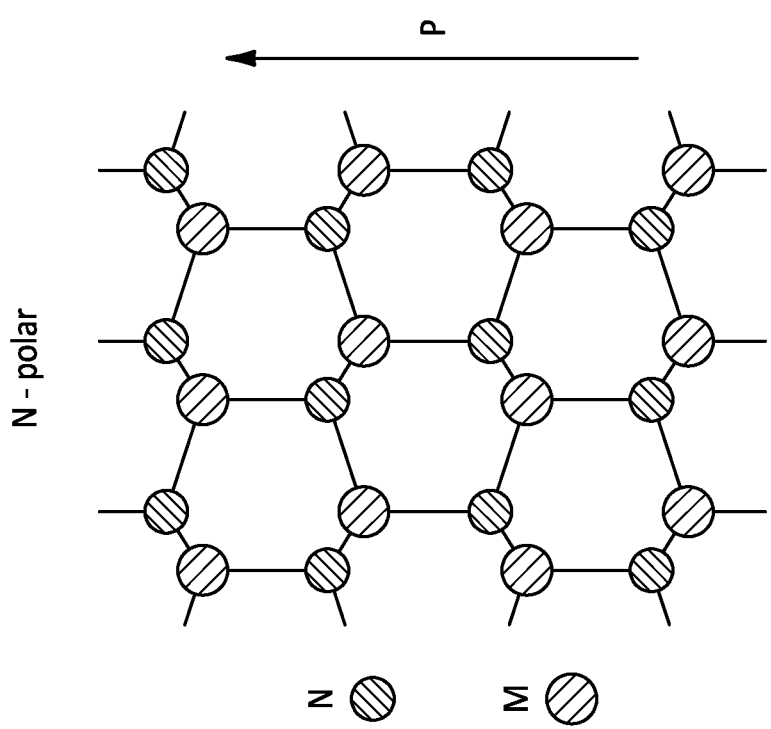

The piezoelectric layer 12 will have a N-polar surface 30 and a metal-polar surface 32, and the piezoelectric layer 12 is formed or otherwise oriented such that the relatively more chemically sensitive N-polar surface 30 forms the frontside surface that faces away from the substrate 20 while the metal-polar surface 32 forms the backside surface and faces toward the substrate 20. Example schematic N-polar crystal orientation is shown in FIG. 2A and the metal-polar crystal orientation is shown in FIG. 2B. This orientation may be effectuated by, for example, being epitaxially grown using molecular beam epitaxy (MBE) or metalorganic chemical vapor deposition (MOCVD) with a growth condition that will result in the N-polar surface 30. Alternatively, the substrate 20 may be modified to promote the growth of N-polar material. For instance, since silicon carbide is a polar material, the choice of initiating growth on the carbon face rather than the conventional silicon face may provide for the formation of N-polar surface 30 with proper growth conditions. Alternate substrates 20 (with proper substrate orientation) may also be utilized to facilitate N-polar growth of the piezoelectric layer 12, such as sapphire ($Al_2O_3$), GaN, or AN.

Orientation of the N-polar surface 30 to be the frontside surface (rather than the conventional backside surface) permits improved chemical resilience during backside processes. Although this orientation results in frontside processing that may need to be more cautious, this orientation facilitates the opportunity to use more aggressive conventional processing during backside processes (including both wet and dry chemistries). For example, acids and bases like HC1, HF, $H_2SO_4$, and $NH_4OH$ may have greatly different etch rates and/or resulting etched surface morphologies for the N-Polar and the metal-polar crystal orientations of piezoelectric layer 12 (see, e.g. Zhuang, D. & Edgar, J. H. *Mater. Sci. Eng. R.* 48, 1-46 (2005)).

Since the frontside is readily accessible, compared to the backside, more processing options are achievable. For example, the incorporation of additional passivation/protection layers or metallization-first process flows are possible during frontside processing. In contrast, backside work must typically be performed with the device wafer mounted to a temporary bonding carrier with a lower thermal budget than a free-standing wafer. Among other issues, the thermal budget impacts the ability to apply dielectric passivation/protection layers during backside processing. Additionally, the aspect ratio (via depth/via width) and typical dimensions of the via(s) 22 shown in FIG. 1, make patterning inside the resonator cavity challenging or impossible. Further, even when possible, the via aspect ratio can result in different and/or less reproducible lithography performance as compared to when processing on the frontside of the wafer where aspect ratio is of little concern (due to the ability for various process elements to effectively interact with the exposed surfaces without the need to transit through the tens to hundreds of microns deep via). By moving the N-polar orientation to the frontside, the more chemical resilient metal-polar orientation will reside at the bottom of the via(s) enabling a wider range of cleaning options that do not negatively impact the backside piezoelectric layer surface mitigating some of the challenges resultant from the lower thermal budget and via aspect ratio.

Figure 3:
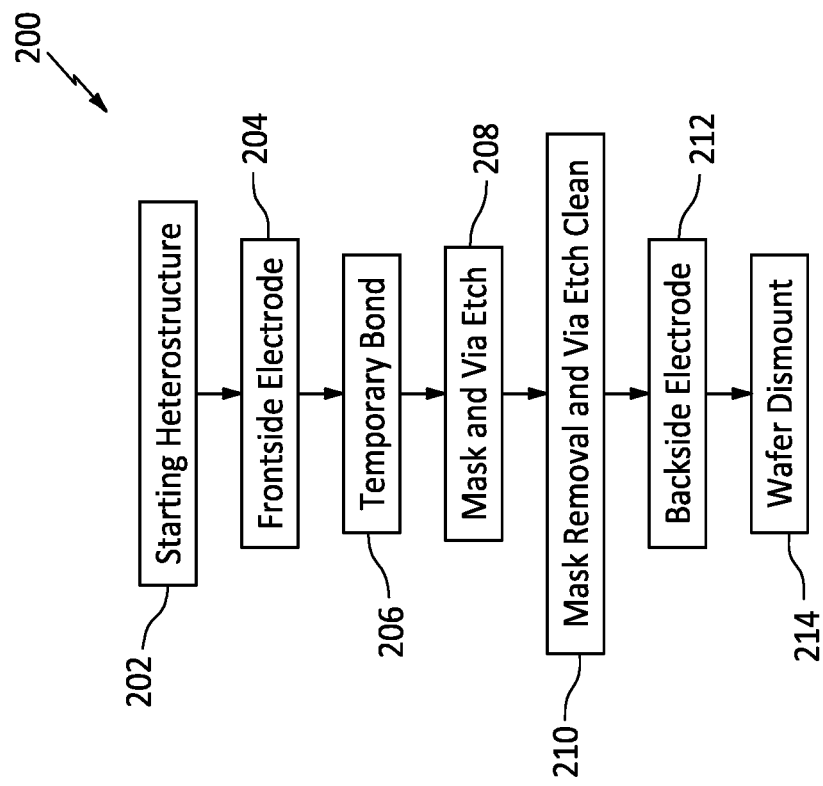
FIG. 3 is a block diagram of a process for the manufacture of the epitaxial nitrogen-polar (N-polar) scandium-doped aluminum nitride (ScAlN) based heterostructure bulk acoustic wave (BAW) resonator.

FIG. 3 schematically illustrates a process 200 for the manufacture of the epitaxial nitrogen-polar (N-polar) scandium-doped aluminum nitride (ScAlN) based heterostructure bulk acoustic wave (BAW) resonator 10 with the frontside N-polar surface 30.

Figure 4:
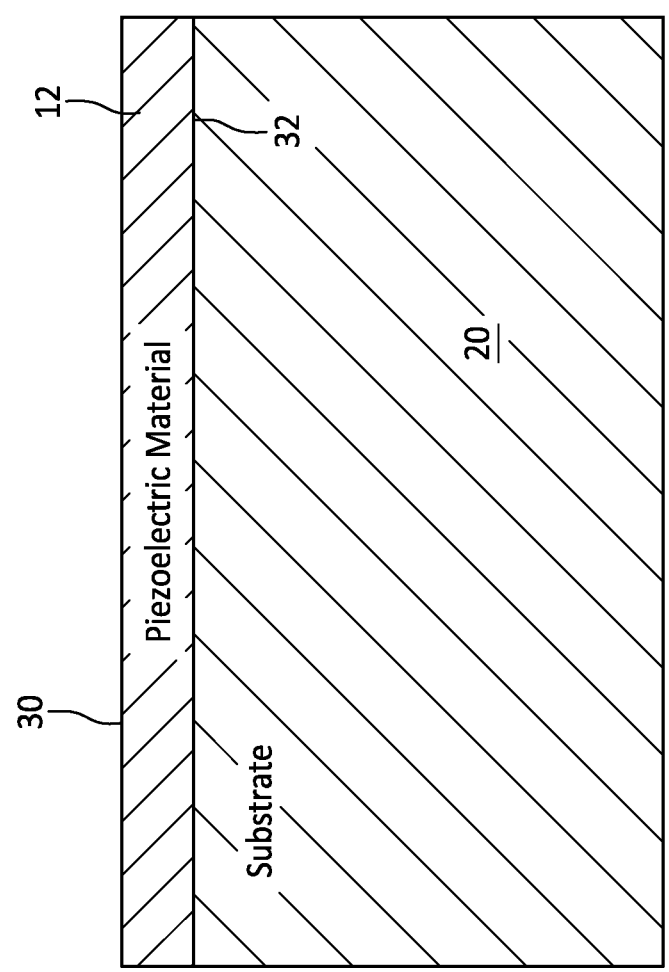
FIGS. 4-9 are schematic cross-sectional views of the epitaxial nitrogen-polar (N-polar) Scandium-doped Aluminum Nitride (ScAlN) based heterostructure bulk acoustic wave (BAW) resonator during representative steps in the process of FIG. 3.

Initially, all or a section of the substrate 20 is patterned with a frontside N-polar surface 30 ScAlN-based heterostructure such that the metal-polar surface 32 forms the backside surface and faces toward the substrate 20 (202; FIG. 4). The substrate 20 disclosed herein can be any substrate suitable for the purposes discussed herein, such as SiC, sapphire, GaN, AN, etc. Because the various heterostructures disclosed herein are N-polar orientated, the orientation of the substrate may need to be consistent with the subsequent growth approach used to form the subsequent layers. Further, the growth of the piezoelectric layer 12 may occur over the entirety of the substrate 20 or only selected areas. It may be desirable, based on other integration needs, to mask regions of the wafer prior to the growth of the piezoelectric layer 12 and/or etch windows to reveal a suitable substrate only in regions of a wafer containing other heterostructure(s) such as a high-electron-mobility transistor. Then, by techniques such as liftoff, selective removal, and/or selective-area growth the piezoelectric layer 12 is limited to only the desired regions. The mono-crystalline piezoelectric layer 12, can be of single composition or multiple compositions (including graded compositions) as needed to balance and optimize the crystal quality, piezoelectric response, and intrinsic stress within the layer for a given application. In some instances, a nucleation layer may be useful in transitioning from one material to the next, for example from substrate to piezoelectric layer(s).

Figure 5:
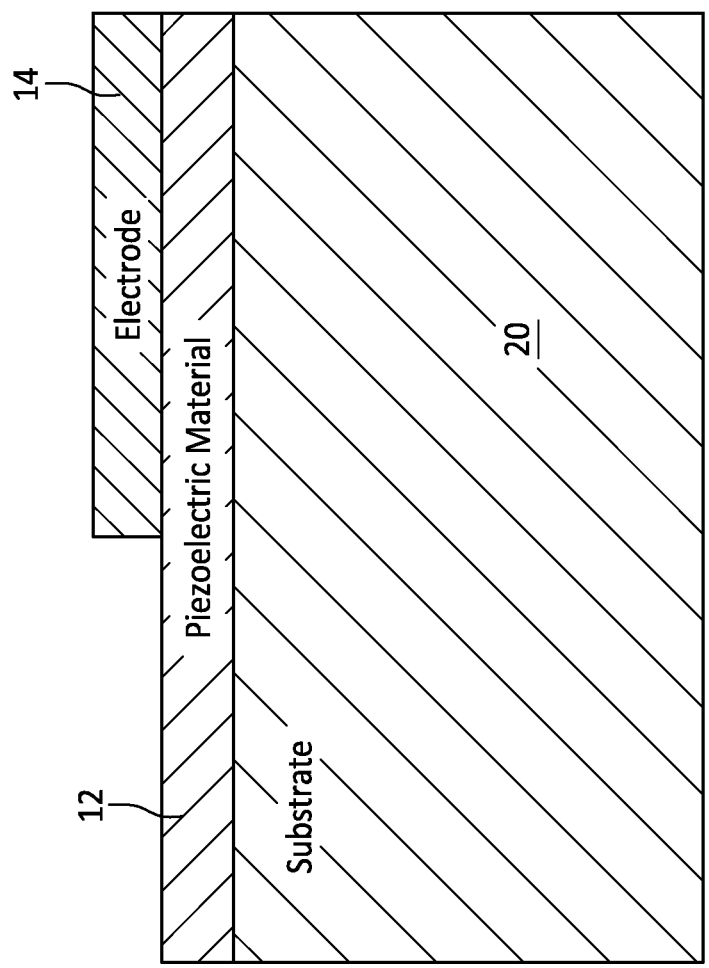

The frontside electrode 14 is then deposited and patterned onto the frontside N-polar surface 30 ScAlN-based heterostructure (204; FIG. 5). Optionally, a dielectric layer may be applied either before or after frontside electrode 14 for passivation and to mechanically load the resonator structure.

Figure 6:
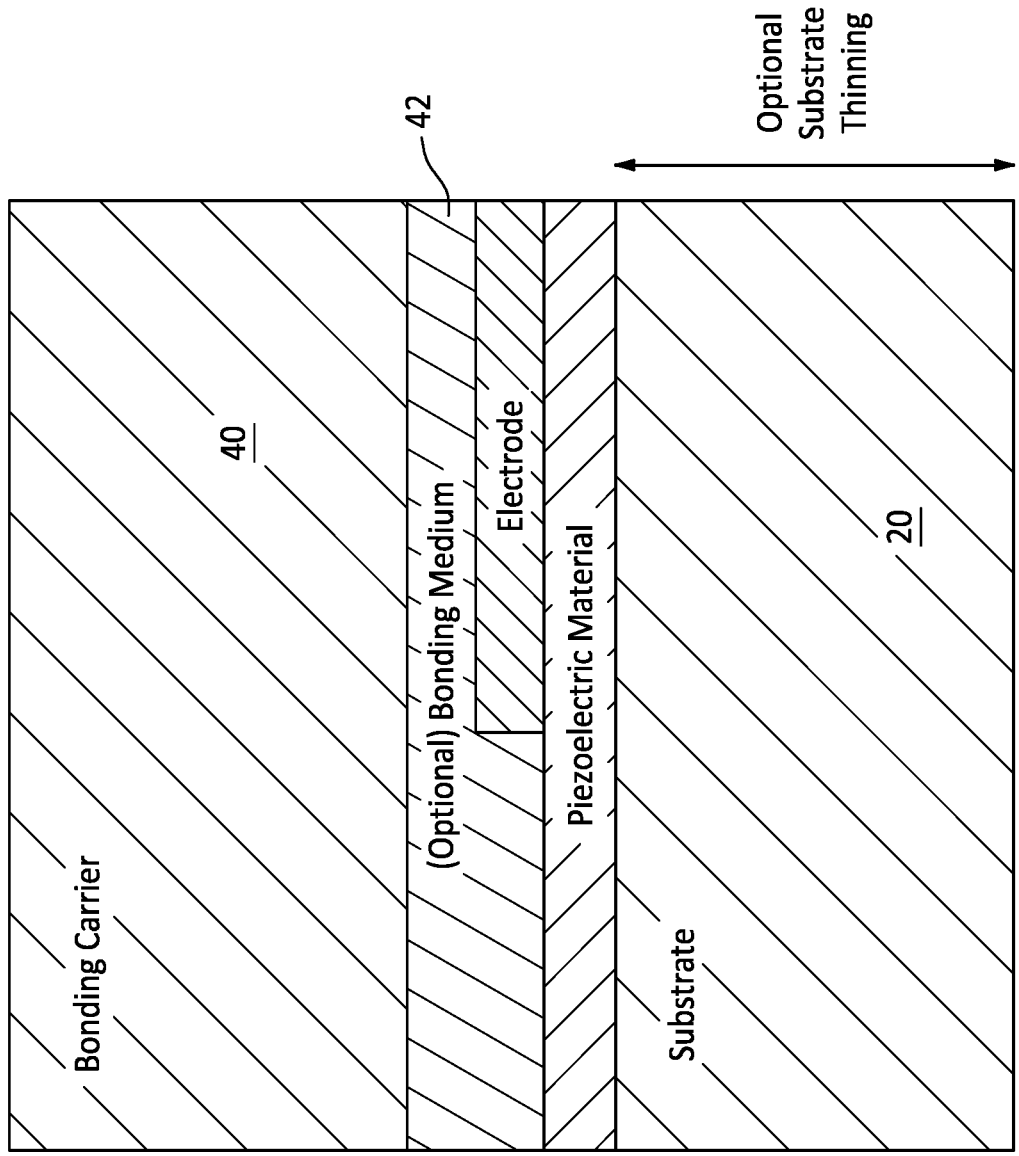

Next, the wafer may be temporarily bonded (206, FIG. 6) to a bonding carrier 40 for access to the backside to begin the backside processes. The temporary mounting technology can utilize a thin adhesive polymer 42 which has a corresponding temperature limit (or thermal budget). As a result, all backside processes may necessarily have a "do not exceed" temperature limit. Once temporarily bonded, the substrate 20 may then be optionally thinned to a desired thickness.

Figure 7:
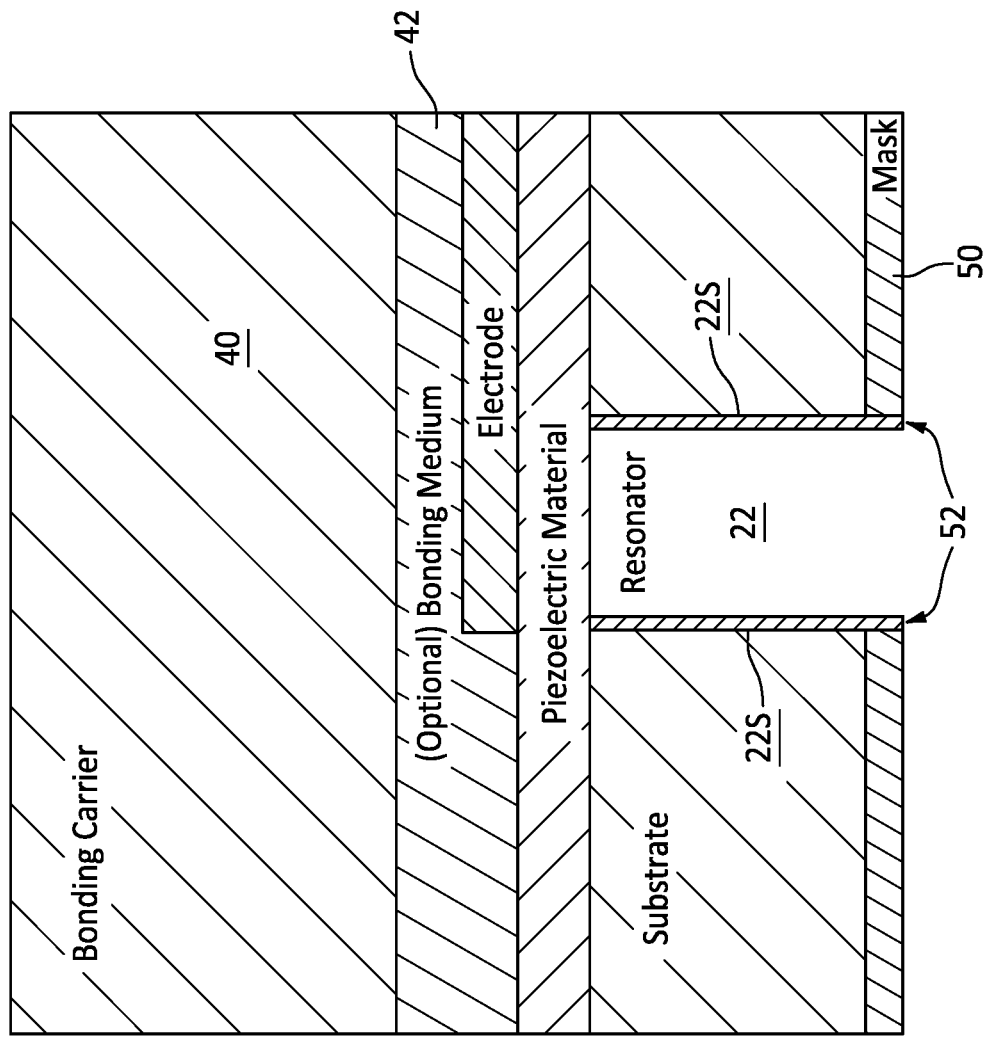

Next a mask 50 is deposited and the vias 22 are etched through the backside of the substrate 20 (208; FIG. 7) forming resonator region 18. The mask 50 may comprise traditional polymer compounds (e.g., photoresist) or "hard mask" compounds (e.g., dielectrics or metals). Etch residue 52 may remain on the sidewalls 22S of the via(s) 22 and the resonator cavities from the etching as is known in the art (see, e.g., Wang et al. *J. Electrochem. Soc.*, Vol. 144, No. 4, 1522-1528 (April 1997)).

Figure 8:
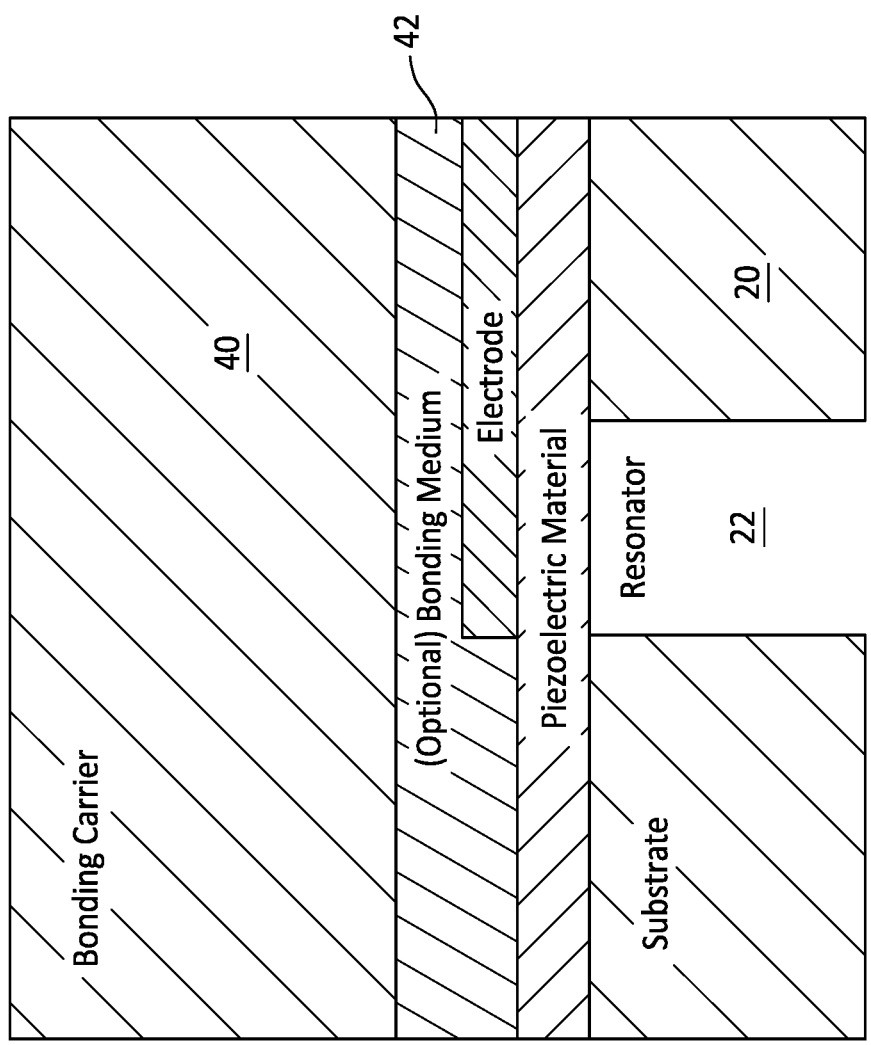

Next, the mask 50 is stripped and the etch residue 52 is removed (210; FIG. 8). This is an otherwise delicate step that is facilitated by the backside metal-polar surface 32 that faces toward the substrate 20. That is, relatively aggressive stripping and etch removal is less likely to harm the backside metal-polar surface 32 as compared to a conventional structure where a N-polar surface would comprise the backside surface. Unlike the frontside of the wafer, where there is essentially direct access to all features on the wafer, backside processing is performed though vias which may be several hundred microns deep depending upon thickness of the substrate. Further, once the vias are formed, the resonator membranes are incredibly thin with essentially no support and are much more sensitive mechanically than they are when processed on the frontside.

Figure 9:
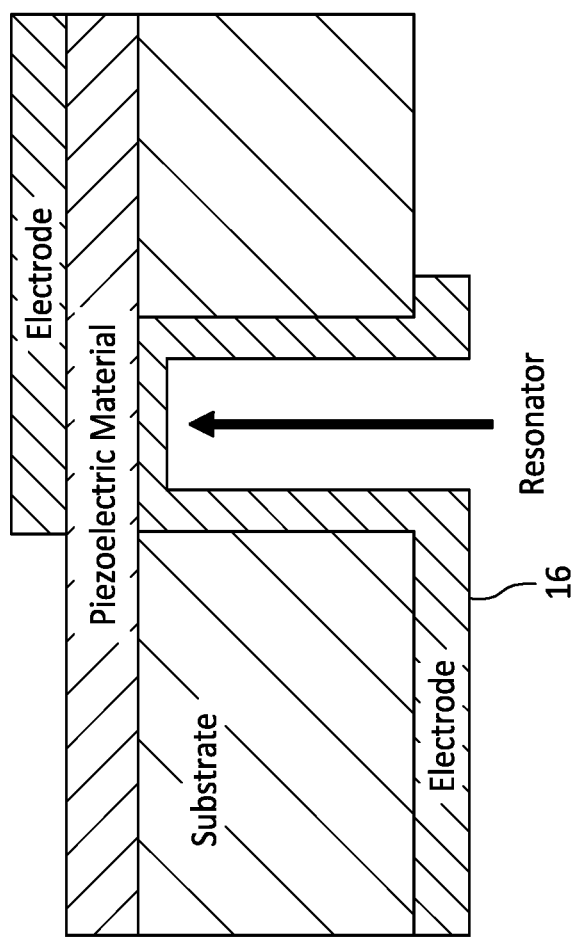

Next, the backside electrode 16 is deposited and patterned onto the backside metal-polar surface 32 ScAlN-based heterostructure (212; FIG. 9).

Finally, the wafer may be demounted (214).

The polarity of the ScAlN has substantial impact on processing considerations and the impact of the polarity can be leveraged advantageously by changing the heterostructure to an N-polar surface orientation during growth (rather than the conventional metal polar orientation). The N-polar heterostructure enables superior backside processing due to the ability to readily protect the wafer frontside and permitting the use of more aggressive processing during backside processing steps which do not harm the metal-polar surfaces.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason, the appended claims should be studied to determine true scope and content.

What is claimed is:

1. A bulk acoustic wave (BAW) resonator, comprising: a substrate; and a piezoelectric layer on the substrate and oriented so that a N-polar surface forms a frontside surface that faces away from the substrate while a metal-polar surface forms a backside surface and faces toward the substrate, wherein the substrate Includes a via and comprising a frontside electrode on a frontside surface of the piezoelectric layer and a backside electrode on an opposite surface of the substrate and contacting the backside of the piezoelectric layer at the via.

2. The bulk acoustic wave (BAW) resonator as recited in claim 1, further comprising a via through the substrate to the metal-polar surface.

3. The bulk acoustic wave (BAW) resonator as recited in claim 1, wherein the substrate comprises silicon carbide.

4. The bulk acoustic wave (BAW) resonator as recited in claim 1, wherein the substrate comprises sapphire.

5. The bulk acoustic wave (BAW) resonator as recited in claim 1, wherein the substrate comprises GaN.

6. The bulk acoustic wave (BAW) resonator as recited in claim 1, wherein the piezoelectric layer comprises a monocrystalline aluminum-nitride-compound.

7. The bulk acoustic wave (BAW) resonator as recited in claim 1, wherein the piezoelectric layer comprises Scandium-doped Aluminum Nitride (ScAlN).

8. The bulk acoustic wave (BAW) resonator as recited in claim 1, wherein the piezoelectric layer comprises yttrium-aluminum-nitride ($Y_xAl_{(1-x)}N$).

9. The bulk acoustic wave (BAW) resonator as recited in claim 1, wherein the metal-polar surface of the piezoelectric layer contacts the substrate.

\* \* \* \* \*